(12) United States Patent
Lo et al.

(10) Patent No.: US 9,234,633 B2
(45) Date of Patent: Jan. 12, 2016

(54) METHOD FOR MANUFACTURING LED LIGHT BAR AND LED LIGHT BAR THEREOF

(71) Applicant: Shenzhen China Star Optoelectronics Technology Co., Ltd., Shenzhen, Guangdong (CN)

(72) Inventors: Changcheng Lo, Shenzhen (CN); Chong Huang, Shenzhen (CN); Yewen Wang, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 100 days.

(21) Appl. No.: 14/345,943

(22) PCT Filed: Jan. 24, 2014

(86) PCT No.: PCT/CN2014/071347
§ 371 (c)(1),
(2) Date: Mar. 19, 2014

(87) PCT Pub. No.: WO2015/109518
PCT Pub. Date: Jul. 30, 2015

(65) Prior Publication Data
US 2015/0204488 A1  Jul. 23, 2015

(30) Foreign Application Priority Data

Jan. 21, 2014  (CN) .......................... 2014 1 0028696

(51) Int. Cl.
*H01L 21/00* (2006.01)
*H01L 33/00* (2010.01)
*F21K 99/00* (2010.01)

(52) U.S. Cl.
CPC ... *F21K 9/30* (2013.01); *F21K 9/90* (2013.01); *Y10T 29/49146* (2015.01)

(58) Field of Classification Search
None
See application file for complete search history.

(56) References Cited

U.S. PATENT DOCUMENTS

2013/0143336 A1* 6/2013 Jain ..................... H01L 33/0079
438/22

FOREIGN PATENT DOCUMENTS

CN       103175013 A     6/2013

* cited by examiner

*Primary Examiner* — Seahvosh Nikmanesh
(74) *Attorney, Agent, or Firm* — Andrew C. Cheng

(57) ABSTRACT

The present invention provides a method for manufacturing an LED light bar and an LED light bar thereof. The method includes (1) providing a metal substrate (20) and a plurality of LED lights (40); (2) forming a graphene layer (60) on the metal substrate (20) in such a way that the graphene layer (60) includes hollow sections (62) formed to correspond to the LED lights (40); (3) mounting the LED lights (40) to the metal substrate (20) in the hollow sections (62); and (4) forming silicone layers (80) in the hollow sections (62). The method for manufacturing the LED light bar and the LED light bar thereof according to the present invention use a graphene layer formed on a metal substrate and use silicone layers for planarization and heat transfer so as to effectively enhance heat dissipation performance of the LED light bar and extend lifespan of the LED light bar.

6 Claims, 2 Drawing Sheets

METHOD FOR MANUFACTURING LED LIGHT BAR AND LED LIGHT BAR THEREOF

BACKGROUND OF THE INVENTION

1. Field of the Invention

The present invention relates to an LED (Light-Emitting Diode) light bar, and in particular to a method for manufacturing an LED light bar and an LED light bar thereof.

2. The Related Arts

Liquid crystal displays (LCDs) have a variety of advantages, such as thin device body, low power consumption, and being free of radiation, and are thus of wide applications, such as mobile phones, personal digital assistants (PDAs), digital cameras, computer monitors, and notebook computer screens.

Most of the liquid crystal displays that are currently available in the market are backlighting liquid crystal displays, which comprise an enclosure, a liquid crystal panel arranged in the enclosure, and a backlight module mounted in the enclosure. The structure of a conventional liquid crystal panel is composed of a color filter (CF) substrate, a thin-film transistor (TFT) array substrate, and a liquid crystal layer arranged between the two substrates and the principle of operation is that a driving voltage is applied to the two glass substrates to control rotation of the liquid crystal molecules of the liquid crystal layer in order to refract out light emitting from the backlight module for generating images. Since the liquid crystal panel itself does not emit light, light must be provided from the backlight module in order to normally display images. Thus, the backlight module is one of the key components of the liquid crystal displays. The backlight modules can be classified in two types, namely a side-edge backlight module and a direct backlight module, according to the site where light gets incident. The direct backlight module comprises a light source, such as a cold cathode fluorescent lamp (CCFL) or a light-emitting diode (LED), which is arranged at the backside of the liquid crystal panel to form a planar light source directly supplied to the liquid crystal display panel. The side-edge backlight module comprises an LED light bar, serving as a backlight source, which is arranged at an edge of a backplane to be located rearward of one side of the liquid crystal display panel. The LED light bar emits light that enters a light guide plate (LGP) through a light incident face at one side of the light guide plate and is projected out of a light emergence face of the light guide plate, after being reflected and diffused, to pass through an optic film assembly so as to form a planar light source for the liquid crystal display panel.

Heat dissipation has always been a primary factor that affects the lifespan of a liquid crystal display device. A major source of heat of a liquid crystal display device is generated by a backlight source. The backlight sources that are conventionally used are generally LED light bars. An LED light bar basically comprises a printed circuit board (PCB) and LED chips that are mounted on and electrically connected with the PCB. The cause that the LED light generates heat is that the electrical power supplied thereto has not been all converted into light energy and a fraction thereof is converted into thermal energy. A characteristic of the LED chip is that a huge amount of heat can be generated in an extremely small volume. The LED chip itself has a small thermal capacity so that the heat must be dissipated with the greatest speed, otherwise an extremely high junction temperature may result.

Heat dissipation of the LED chip is attracting more and more attention. This is because light decay or lifespan of an LED chip is directly associated with the junction temperature thereof. Poor heat dissipation leads to a high junction temperature and a short lifespan. According to Arrhenius Law, the lifespan would be extended by two times for every temperature drop of 10° C.

An LED light bar heat dissipation solution commonly adopted in a conventional liquid crystal display device is a heat dissipation plate arranged between a PCB and a backplane to transmit as efficiently as possible heat generated by an LED chip to the outside. However, such as heat dissipation solution is imperfect. If the heat dissipation plate is arranged to be a metal-made heat dissipation plate, then the weight of a backlight module would be increased.

Graphene is a novel type of material having advantages of temperature resistance, small thermal expansion coefficient, thermal conductivity, electrical conductivity, and small friction coefficient and can be attached to a curved surface or an irregular surface. Heat dissipation with grapheme shows relatively high horizontal thermal conductivity (see FIG. 1), enabling efficient conduction of energy in a horizontal direction to make uniform distribution of thermal energy over an enter surface in the horizontal direction and eliminating localized hot spots.

| materials | | thermal conductivity (W/m · K) |
|---|---|---|
| common metals | silver | 429 |
| | copper | 401 |
| | gold | 317 |
| | aluminum | 237 |
| carbon based materials | GTS (Thermal Graphite Sheet) | 1500-1700 |
| | CNT (Carbon Nano Tube) | 3000-3500 |
| | diamond | 1000-2200 |
| | graphene | 4000-6000 |
| others | silicone gel | 1-3 |

It can be seen from the above table that graphene has the largest thermal conductivity. Using graphene as a heat dissipation material for an LED light bar would greatly improve the performance of heat dissipation and extend the lifespan of the LED light bar thereby extending the lifespan of a liquid crystal display device using the LED light bar.

SUMMARY OF THE INVENTION

An object of the present invention is to provide a method for manufacturing an LED (Light-Emitting Diode) light bar, which has a simple process, effectively enhances the heat dissipation performance of an LED light bar, and extends the lifespan of the LED light bar.

Another object of the present invention is to provide an LED light bar, which has a simple structure, excellent heat dissipation performance, and extended lifespan.

To achieve the above objects, the present invention provides a method for manufacturing an LED light bar, comprising the following steps:

(1) providing a metal substrate and a plurality of LED lights;

(2) forming a graphene layer on the metal substrate in such a way that the graphene layer comprises hollow sections formed to correspond to the LED lights;

(3) mounting the LED lights to the metal substrate in the hollow sections; and (4) forming silicone layers in the hollow sections.

The metal substrate is a thin copper substrate, a thin aluminum substrate, a thin nickel structure, or a thin ruthenium substrate.

The graphene layer is formed through chemical vapor deposition on the metal substrate.

The metal substrate is a thin copper substrate and chemical vapor deposition is carried out in an environment of 500-1050° C. and 10 Pa-5 kPa by using hydrocarbons as a carbon source gas and hydrogen or argon being a carrying gas.

The carbon source gas is one of methane, ethylene, and acetylene or a mixed gas thereof.

The graphene layer has a thickness of 0.35 nm-50 nm and the silicone layer has a thickness of 10 μm-3 mm.

The present invention also provides an LED light bar, which comprises: a substrate and LED lights mounted on the substrate. The substrate comprises a metal substrate, a graphene layer formed on the metal substrate, and silicone layers formed on the metal substrate. The graphene layer comprises hollow sections formed to corresponding to the LED lights. The LED lights are mounted to the metal substrate in the hollow sections. The silicone layers are formed on the hollow sections.

The metal substrate is a thin copper substrate, a thin aluminum substrate, a thin nickel structure, or a thin ruthenium substrate; the graphene layer is formed through chemical vapor deposition on the metal substrate; the graphene layer has a thickness of 0.35 nm-50 nm; and the silicone layer has a thickness of 10 μm-3 mm.

The metal substrate is a thin copper substrate and chemical vapor deposition is carried out in an environment of 500-1050° C. and 10 Pa-5 kPa by using hydrocarbons as a carbon source gas and hydrogen or argon being a carrying gas.

The carbon source gas is one of methane, ethylene, and acetylene or a mixed gas thereof.

The present invention further provides an LED light bar, which comprises: a substrate and LED lights mounted on the substrate, the substrate comprising a metal substrate, a graphene layer formed on the metal substrate, and silicone layers formed on the metal substrate, the graphene layer comprising hollow sections formed to corresponding to the LED lights, the LED lights being mounted to the metal substrate in the hollow sections, the silicone layers being formed on the hollow sections;

wherein the metal substrate is a thin copper substrate, a thin aluminum substrate, a thin nickel structure, or a thin ruthenium substrate; the graphene layer is formed through chemical vapor deposition on the metal substrate; the graphene layer has a thickness of 0.35 nm-50 nm; and the silicone layer has a thickness of 10 μm-3 mm.

The metal substrate is a thin copper substrate and chemical vapor deposition is carried out in an environment of 500-1050° C. and 10 Pa-5 kPa by using hydrocarbons as a carbon source gas and hydrogen or argon being a carrying gas.

The carbon source gas is one of methane, ethylene, and acetylene or a mixed gas thereof.

The efficacy of the present invention is that the present invention provides a method for manufacturing an LED light bar and an LED light bar thereof, in which a graphene layer is formed on the metal substrate and silicone layers are applied for planarization and heat transfer so as to effectively enhance heat dissipation performance of the LED light bar and extend lifespan of the LED light bar.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
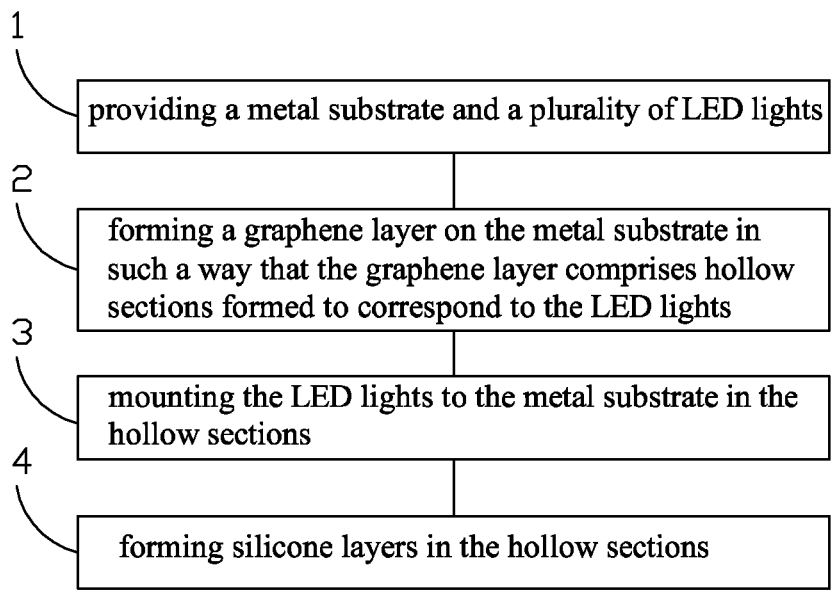
FIG. 1 is a flow chart illustrating a method for manufacturing an LED (Light-Emitting Diode) light bar according to the present invention.
Figure 2:
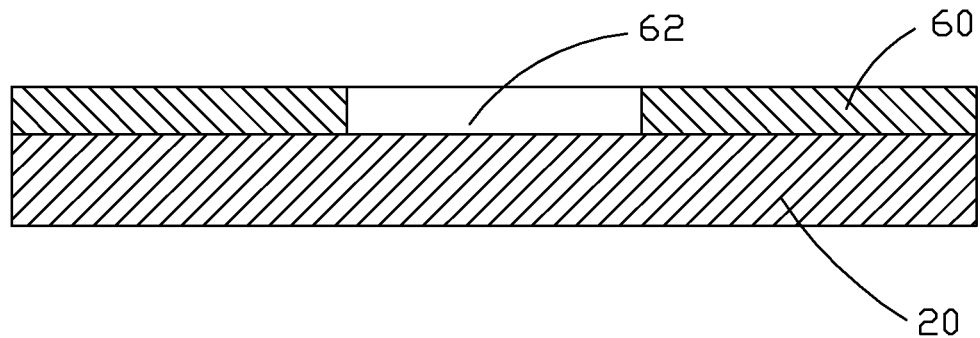
FIGS. 2-4 are schematic views illustrating the process of manufacturing of an LED light bar according to the present invention.
Figure 3:
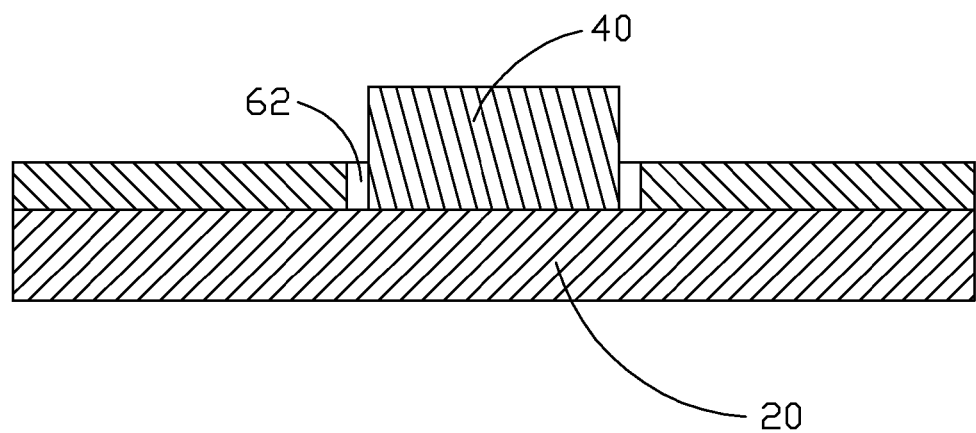
Figure 4:
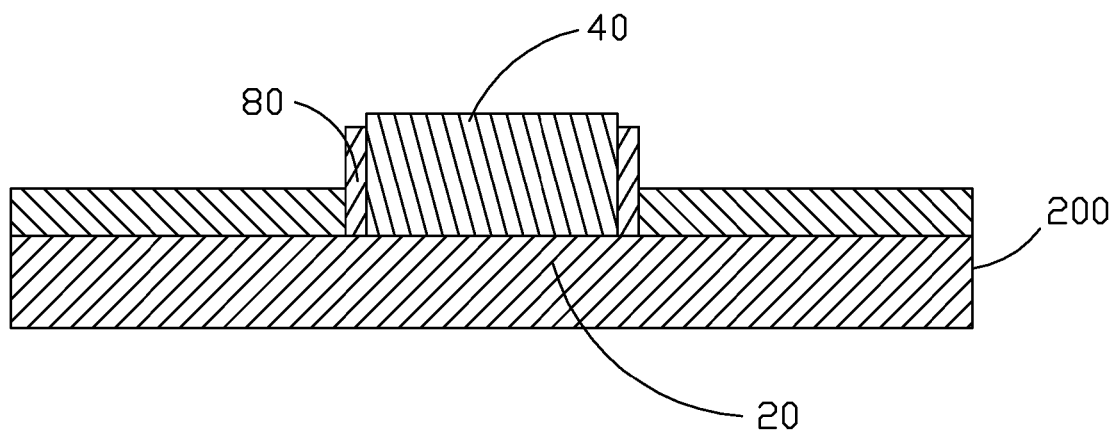

Referring to FIG. 1, with additional reference to FIGS. 2-4, the present invention provides a method for manufacturing an LED (Light-Emitting Diode) light bar, which comprises the following steps:

Step 1: providing a metal substrate 20 and a plurality of LED lights 40.

The metal substrate 20 can be a thin copper (Cu) substrate, a thin aluminum (Al) substrate, a thin nickel (Ni) substrate, or a thin ruthenium (Ru) substrate. In the instant embodiment, the metal substrate 20 is a thin copper substrate.

Step 2: forming a graphene layer 60 on the metal substrate 20 in such a way that the graphene layer 60 comprises hollow sections 62 formed to correspond to the LED lights 40.

In the instant embodiment, the graphene layer 60 has a thickness of 0.35 nm-50 nm, which is formed through chemical vapor deposition on the metal substrate 20.

Further, the metal substrate 20 is a thin copper substrate. The chemical vapor deposition is carried out in an environment of 500-1050° C. and 10 Pa-5 kPa by using hydrocarbons as a carbon source gas and hydrogen ($H_2$) or argon (Ar) being a carrying gas, wherein the carbon source gas can be one of the hydrocarbon gases of methane ($CH_4$), ethylene ($C_2H_4$), and acetylene ($C_2H_2$) or a mixed gas thereof.

Specifically, with the thin copper substrate being a growth base, a mixed gas of methane and hydrogen, or a mixed gas of methane and argon, or a mixed gas of ethylene and hydrogen or argon is introduced into the chemical vapor deposition reaction chamber in an environment of 500-1050° C. and 10 Pa-5 kPa to allow carbon atoms to separate from the carbon source gas and grow on the thin copper substrate.

Step 3: mounting the LED lights 40 to the metal substrate 20 in the hollow sections 62.

Specifically, the LED lights 40 can be mounted to the metal substrate 20 by means of soldering.

Step 4: forming silicone layers 80 in the hollow sections 62.

In the instant embodiment, the silicone layers 80 have a thickness of 10 μm-3 mm and surround circumferences of the LED lights 40 to planarize the hollow sections 62 of the graphene layer 60 and also to transfer heat generated by the LED lights 40 to the metal substrate 20 and the graphene layer 60 for dissipation of heat.

Referring to FIG. 4, with additional reference to FIGS. 2 and 3, the present invention also provides an LED light bar, which comprises: a substrate 200 and LED lights 40 mounted on the substrate 200. The substrate 200 comprises a metal substrate 20, a graphene layer 60 formed on the metal substrate 20, and silicone layers 80 formed on the metal substrate 20. The graphene layer 60 comprises hollow sections 62 formed to corresponding to the LED lights 40. The LED lights 40 are mounted to the metal substrate 20 in the hollow sections 62. The silicone layers 80 are formed on the hollow sections 62.

Specifically, the metal substrate 20 can be a thin copper (Cu) substrate, a thin aluminum (Al) substrate, a thin nickel (Ni) substrate, or a thin ruthenium (Ru) substrate. In the instant embodiment, the metal substrate 20 is a thin copper substrate. The LED lights 40 can be mounted to the metal substrate 20 by means of soldering.

In the instant embodiment, the graphene layer 60 has a thickness of 0.35 nm-50 nm, which is formed through chemical vapor deposition on the metal substrate 20.

Further, the metal substrate 20 is a thin copper substrate. The chemical vapor deposition operation is carried out in an environment of 500-1050° C. and 10 Pa-5 kPa by using hydrocarbons as a carbon source gas and hydrogen ($H_2$) or argon (Ar) being a carrying gas, wherein the carbon source gas can be one of the hydrocarbon gases of methane ($CH_4$), ethylene ($C_2H_4$), and acetylene ($C_2H_2$) or a mixed gas thereof.

Specifically, with the thin copper substrate being a growth base, a mixed gas of methane and hydrogen, or a mixed gas of methane and argon, or a mixed gas of ethylene and hydrogen or argon is introduced into the chemical vapor deposition reaction chamber in an environment of 500-1050° C. and 10 Pa-5 kPa to allow carbon atoms to separate from the carbon source gas and grow on the thin copper substrate.

The silicone layers 80 have a thickness of 10 μm-3 mm and surround circumferences of the LED lights 40 to planarize the hollow sections 62 of the graphene layer 60 and also to transfer heat generated by the LED lights 40 to the metal substrate 20 and the graphene layer 60 for dissipation of heat.

In summary, the present invention provides a method for manufacturing an LED light bar and an LED light bar thereof, in which a graphene layer is formed on the metal substrate and silicone layers are applied for planarization and heat transfer so as to effectively enhance heat dissipation performance of the LED light bar and extend lifespan of the LED light bar.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing an LED (Light-Emitting Diode) light bar, comprising the following steps:
   (1) providing a metal substrate and a plurality of LED lights;
   (2) forming a graphene layer on the metal substrate in such a way that the graphene layer comprises hollow sections formed to correspond to the LED lights;
   (3) mounting the LED lights to the metal substrate in the hollow sections; and
   (4) forming silicone layers in the hollow sections.

2. The method for manufacturing the LED light bar as claimed in claim 1, wherein the metal substrate is a thin copper substrate, a thin aluminum substrate, a thin nickel structure, or a thin ruthenium substrate.

3. The method for manufacturing the LED light bar as claimed in claim 2, wherein the graphene layer is formed through chemical vapor deposition on the metal substrate.

4. The method for manufacturing the LED light bar as claimed in claim 3, wherein the metal substrate is a thin copper substrate and chemical vapor deposition is carried out in an environment of 500-1050° C. and 10 Pa-5 kPa by using hydrocarbons as a carbon source gas and hydrogen or argon being a carrying gas.

5. The method for manufacturing the LED light bar as claimed in claim 4, wherein the carbon source gas is one of methane, ethylene, and acetylene or a mixed gas thereof.

6. The method for manufacturing the LED light bar as claimed in claim 1, wherein the graphene layer has a thickness of 0.35 nm-50 nm and the silicone layer has a thickness of 10 μm-3 mm.

* * * * *